(12) United States Patent
Benckenstein, Jr. et al.

(10) Patent No.: US 8,825,418 B2
(45) Date of Patent: Sep. 2, 2014

(54) POWER SUPPLY USAGE DETERMINATION

(71) Applicant: Southwest Electronic Energy Group, Missouri City, TX (US)

(72) Inventors: Claude Leonard Benckenstein, Jr., Missouri City, TX (US); Clint Alfred Davis, Houston, TX (US); Dean Perkins, Tomball, TX (US)

(73) Assignee: Southwest Electronic Energy Corporation, Missouri City, TX (US)

( * ) Notice: Subject to any disclaimer, the term of this patent is extended or adjusted under 35 U.S.C. 154(b) by 0 days.

(21) Appl. No.: 13/964,677

(22) Filed: Aug. 12, 2013

(65) Prior Publication Data

US 2013/0332094 A1 Dec. 12, 2013

Related U.S. Application Data

(63) Continuation of application No. 13/525,549, filed on Jun. 18, 2012, now Pat. No. 8,532,946, which is a continuation of application No. 13/036,435, filed on Feb. 28, 2011, now Pat. No. 8,229,689, which is a continuation of application No. 12/190,835, filed on Aug. 13, 2008, now Pat. No. 7,917,315.

(51) Int. Cl.
*G01R 31/36* (2006.01)

(52) U.S. Cl.
USPC ............................ 702/63; 320/132; 320/149

(58) Field of Classification Search
USPC .......... 702/60, 61, 63–65, 136; 320/132, 149; 324/426–428
See application file for complete search history.

(56) References Cited

U.S. PATENT DOCUMENTS 5,841,284 A * 11/1998 Takahashi ...................... 324/428
2005/0058885 A1* 3/2005 Brocklin et al. ................ 429/65

* cited by examiner

*Primary Examiner* — Manuel L Barbee
(74) *Attorney, Agent, or Firm* — Fulbright & Jaworski LLP

(57) ABSTRACT

The remaining capacity of a power source, such as a battery, may be monitored with a microprocessor by integrating data received from a current sensor. The microprocessor may measure electrons passing through the battery by sampling the integrator and summing the values recorded from the integrator. Each time the integrator is sampled, the microprocessor may reset the integrator to prevent the integrator from saturating. The microprocessor may sample the integrator when the integrator approaches a predetermined value. The remaining capacity of the battery may be calculated based on calibration values and the sum of electrons measured by the integrator. The remaining capacity may be communicated to remote users through a network and displayed in an executive dashboard.

20 Claims, 4 Drawing Sheets

POWER SUPPLY USAGE DETERMINATION

CROSS REFERENCE TO RELATED APPLICATIONS

This application is a continuation of U.S. patent application Ser. No. 13/525,549 to Claude Leonard Beckenstein, Jr. et al., filed on Jun. 18, 2012, and entitled "Power Supply Usage Determination," which is a continuation of U.S. patent application Ser. No. 13/036,435 to Claude Leonard Beckenstein, Jr. et al., filed on Feb. 28, 2011, and entitled "Method for Determining Power Supply Usage," which is a continuation of U.S. Pat. No. 7,917,315 to Claude Leonard Benckenstein, Jr. et al., filed on Aug. 13, 2008, and entitled "Method for Determining Power Supply Usage," each of which are hereby incorporated by reference.

TECHNICAL FIELD

The present embodiments relate to a method for measuring electron flow to determine remaining capacity of a power supply, such as a lithium primary battery, a lithium ion battery, a lead-acid battery, a fuel cell, a solar panel system, or other power supply.

BACKGROUND

A need exists for a method that accurately measures and tracks electron flow that is portably usable in many environments, easy to undertake, and inexpensive to operate.

A further need exists for a method that can be installed on a wide variety of power supplies for remote and close proximity monitoring of electron usage by a customer, a user, and an administrator simultaneously, that does not require measurement of time to determine remaining capacity.

The present embodiments meet these needs.

BRIEF DESCRIPTION OF THE DRAWINGS

The detailed description will be better understood in conjunction with the accompanying drawings as follows.

DETAILED DESCRIPTION

Figure 1:
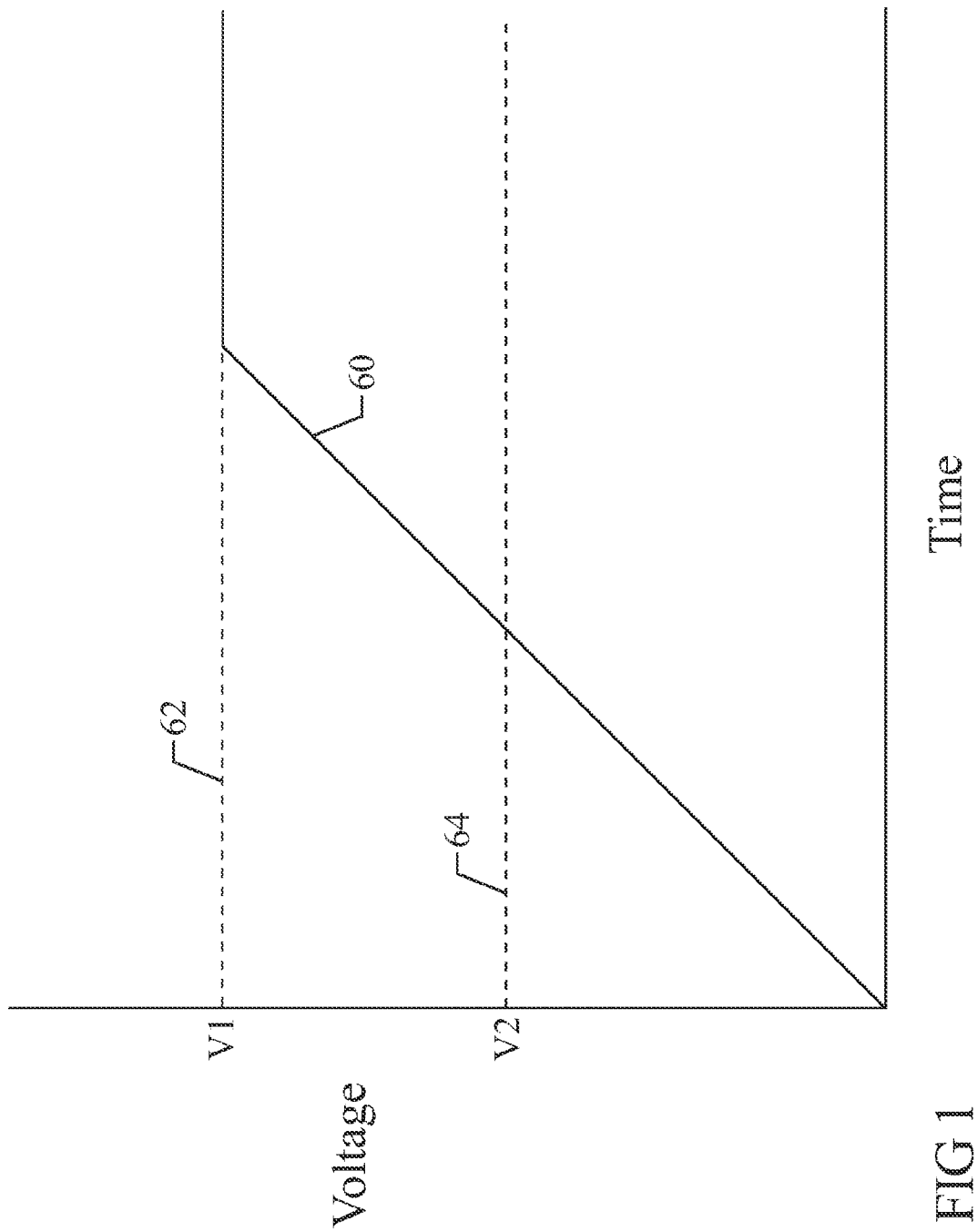
FIG. 1 is a depiction of an amplitude signal for use herein according to one embodiment of the disclosure.

Before explaining the present embodiments in detail, it is to be understood that the invention is not limited to the particular embodiments and that it can be practiced or carried out in various ways.

The present embodiments relate to a method for tracking electron flow from a power supply using a networked system. The system can utilize alarms and/or meters when electron flow is at a reduced level by accurately and with high precision tracking the electron flow.

Typically, remaining capacity of a power source is measured by recording the amount of current maintained per a unit of time. In extreme conditions, such as the high temperatures and pressures encountered within a wellbore, the accurate tracking of the passage of time, such as through use of a processor-based clock, is not possible.

The present method enables measurement of the capacity of a power source independent of elapsed time by tracking electron flow, rather than current per unit time. During operation of a power source, current is measured and converted to a voltage proportional to the current. The voltage proportional to current is converted and recorded as a monotonic uni-polar representation of an aggregate number of electrons. Subsequent representations are accumulated until this value reaches a calibration constant, at which time a known quantity of current has been maintained, such as one mA/hour, enabling capacity of the power source to be calculated in standard engineering units. The accumulated value can then be reset, allowing further accumulation until the calibration constant is again reached.

The method relates to counting electrons from a power supply.

First, a current from a power source is measured which is then termed "a measured current."

The power supply can be a lithium primary battery, a lithium-ion battery, a lead acid battery, a fuel cell, or another source of electrical energy that provides a flow of electrons in a direct current, such as electrons generated by an alternator of a car, or a generator of a boat or RV.

Next, the measured current is converted to a voltage. The conversion occurs, in an embodiment, using a current sense resistor, such as a model WSL2512RI000FEA resistor made by Vishay of the state of Pennsylvania. The current sense resistor can handle between about 0 amps and about 6 amps. This current sense resistor is placed in series with the load, the load being the device powered by the power supply. In this configuration the current at the current sense resistor is the same at the current drawn off the power supply.

The current can be a pulsed current or a constant current. In an embodiment, if the current is pulsed, is can be pulsed at about 2 amps every one second or about 1 amp every 2 seconds, or other variations of pulsed current. If the current is constant, for example, it can be about 100 mA.

The converted current is integrated into a monotonic unipolar representation of an aggregate number of electrons through a Deboo integrator. The amplitude of the voltage is representative of the aggregate number of electrons flowing through a current sense resistor after integration using a Deboo (non-inverting) integrator with a capacitor.

The Deboo integrator is a non-inverting uni-polar integrator that forms a monotonic, unidirectional signal, wherein the amplitude represents the number of electrons flowed, similar to a trip odometer tracking mileage of a car. Other integrators can be usable herein, such as passive integrators generally known in the field of electrical engineering.

When the integrator output voltage reaches a preset limit, or a threshold, then the monotonic uni-polar representation of the aggregate number of electrons is "read" by the microprocessor forming a reading internal to the microprocessor. This reading is representative of the fact the preset limit has been reached and a corresponding number of electrons have passed through the current sense resistor.

Using an analog-to-digital converter, such as a AD7819 made by Analog Devices, the monotonic uni-polar representation of the number of aggregate electrons is identified and stored in memory of the microprocessor. Additionally, in an embodiment it is contemplated that the reading is formed using an analog to digital converter within the microprocessor.

Prior to electron saturation, the reading can be made by the microprocessor, which can be a model MC908QBMDTE, made by Freescale of Austin, Tex. The microprocessor has a processor and data storage containing computer instructions for instructing the processor to accumulate the amplitude each time the output of the integrated reaches a preset limit.

Each reading is added to a memory location in the data storage where it is combined with previous readings forming a summation.

The microprocessor contains instructions for storing the value of the amplitude voltage and for adding each value to a previous sum forming a running summation. The summation, being representative of the number of times the output of the integrator has reached the preset limit, which is also proportional to the total charge which has passed from the power source.

Additionally, the microprocessor contains instructions for resetting the integrator, or discharging the integrator, once the voltage of the amplitude signal reaches a preset limit. Once this occurs, the amplitude signal will be reset, and will generally increase as a function of the signal input into the integrate as previously described.

The readings are repeated by actuating of the microprocessor before the integrator reaches the preset limit. With each reading, the accumulator value is transmitted to the accumulator, and the summation continues, causing the accumulator value to increase or remain constant, but never decrease.

The summation is then compared to a calibration value stored on the microprocessor for the particular fuel gauge. The calibration value is preloaded in the data storage. The calibration value is unique to each designated fuel gauge circuit. An example of a calibration value is 14,000. It should be noted that when the accumulator reaches the calibration constant, a known quantity of power has flowed, such as 1 mAH, enabling accurate electron tracking and determination of power source capacity.

The comparison can then be recorded as an established standard engineering unit of capacity, such as Amp Hours, when the summation of accumulator values meets or exceeds the calibration value.

In an additional embodiment, the fuel gauge can monitor and record ambient temperature, that is the temperature surrounding the power supply using a temperature sensor. After the temperature is read, then the established standard engineering unit of capacity is adjusted based on the ambient temperature.

In the fuel gauge, the current sense resistor is a sensor that determines current proportional to voltage. An example of such a current sense resistor is model WSL2512RI000FEA made by Vishay of Pennsylvania.

The microprocessor used in the method enables the sensing of electron flow at temperatures ranging from about −40 degrees Centigrade to about 150 degrees Centigrade.

It should be noted that the established standard engineering unit of capacity, from the microprocessor, can be determined using a reader in a manner known to those in the field of electrical engineering.

In one embodiment, the fuel gauge can have a reader that communicates the established standard engineering unit of capacity to a user who is using at least one light emitting diode.

The communication from the reader can be over a wireless network, a hard wired network, a satellite network, or combinations thereof. The user can be connected to a website, or be connected to a graphical user interface display directly for viewing electron flow, and the fuel usage occurring to the power supply.

When the reader is in communication with a network, the fuel gauge permits continuous and automatic remote monitoring of power supply capacity.

An example of automatic, and continuous, real time monitoring is with an executive dashboard that is continually pushing the data to the user, rather than the user asking for the data. This push enables better and more accurate monitoring of the fuel use.

Monitoring using an executive dashboard enables a user to view that constant status of multiple power supplies, such as batteries, each connected via the network for constant and highly accurate measurement, such within 1 mV. Monitoring using an executive dashboard also allows for less waste of fuel, particularly in a remote environment, such as a recharging station for military radios in the middle of a barren arctic wasteland.

In an embodiment it is contemplated that the capacitor of the integrator has at least two miniature 0.01 microfarad value capacitors, each having a low loss, high temperature rating, such as 125 Centigrade, with a moderately high capacitance.

It is contemplated that a moderately high capacitance would be equivalent to about 0.22 microfarads for each capacitor.

The two capacitors can be contemplated to be connected in parallel and therefore provide a capacitance of about 0.44 microfarads. An example of such a miniature 0.01 microfarad value capacitor would be a high tech plastic fill capacitor made by Fujitsu.

A different embodiment contemplates that the capacitor can be a precision capacitor, which would have a capacity of about 0.02 microfarads.

In an embodiment the preset limit of aggregate electrons can be no more than three volts using a 12 bit converter.

Turning now to the figures, FIG. 1 illustrates a representative amplitude signal produced by the integrator for use in the invention herein. The voltage (60) produced by the integrator is a function of the voltage of the current sense resistor. The signal produced in FIG. 1 represents a generally linear increase in the voltage output by the integrator as a result of a generally constant input voltage. FIG. 1 also illustrates the saturation point $V_1$ (62) of the integrator. It can be seen once the integrator becomes saturated, the output voltage no longer increases regardless of the input voltage. FIG. 1 illustrates a preset limit (64) at $V_2$, which is selected at a voltage below the saturation point $V_1$ (62) of the integrator. In the operation of the device a reading will be taken when the preset limit (64) is reached and the integrator will be discharged. The amplitude signal can vary based upon the input signal in a predictable way known to those in the art based on the configuration of the integrator.

Figure 2A:
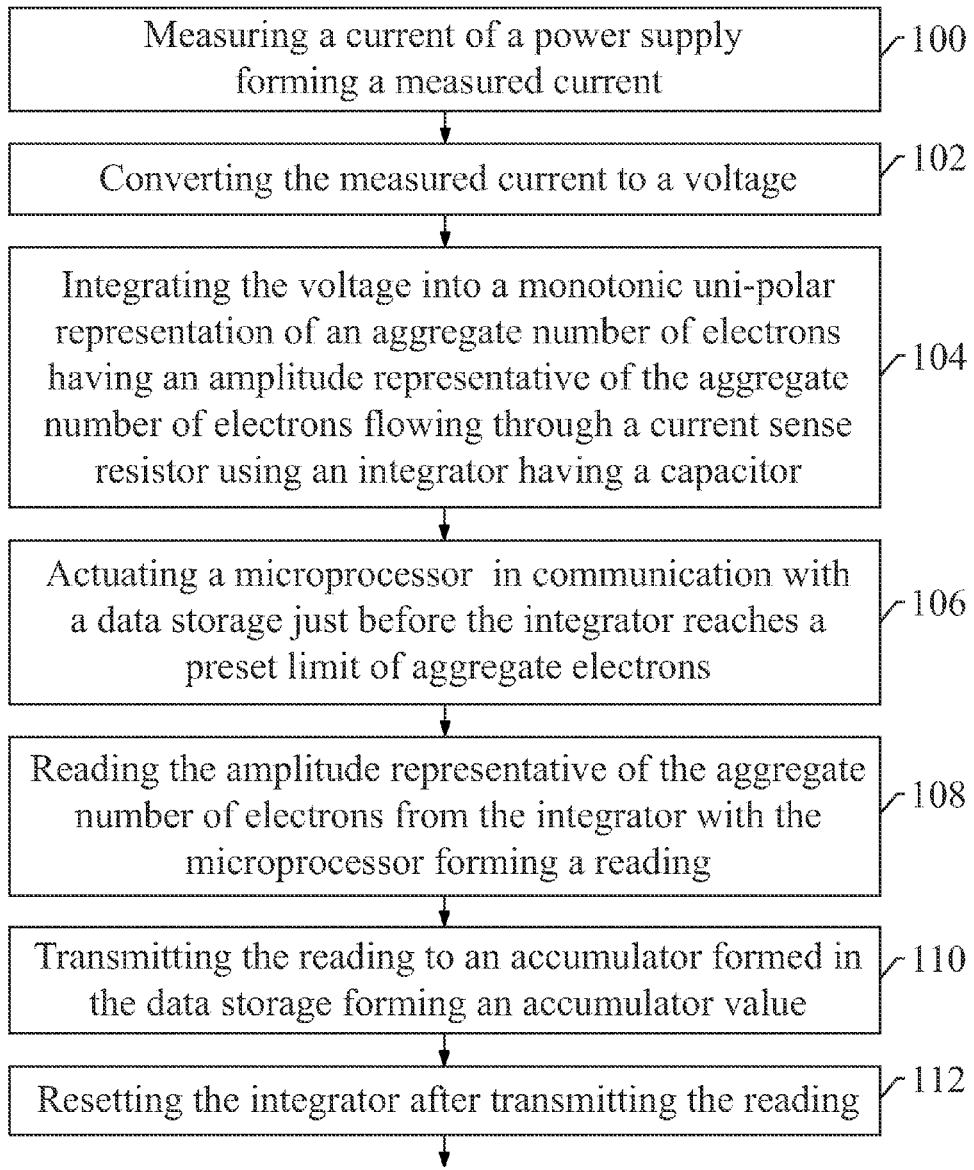
FIG. 2 is a flow chart of the method according to one embodiment of the disclosure.
Figure 2B:
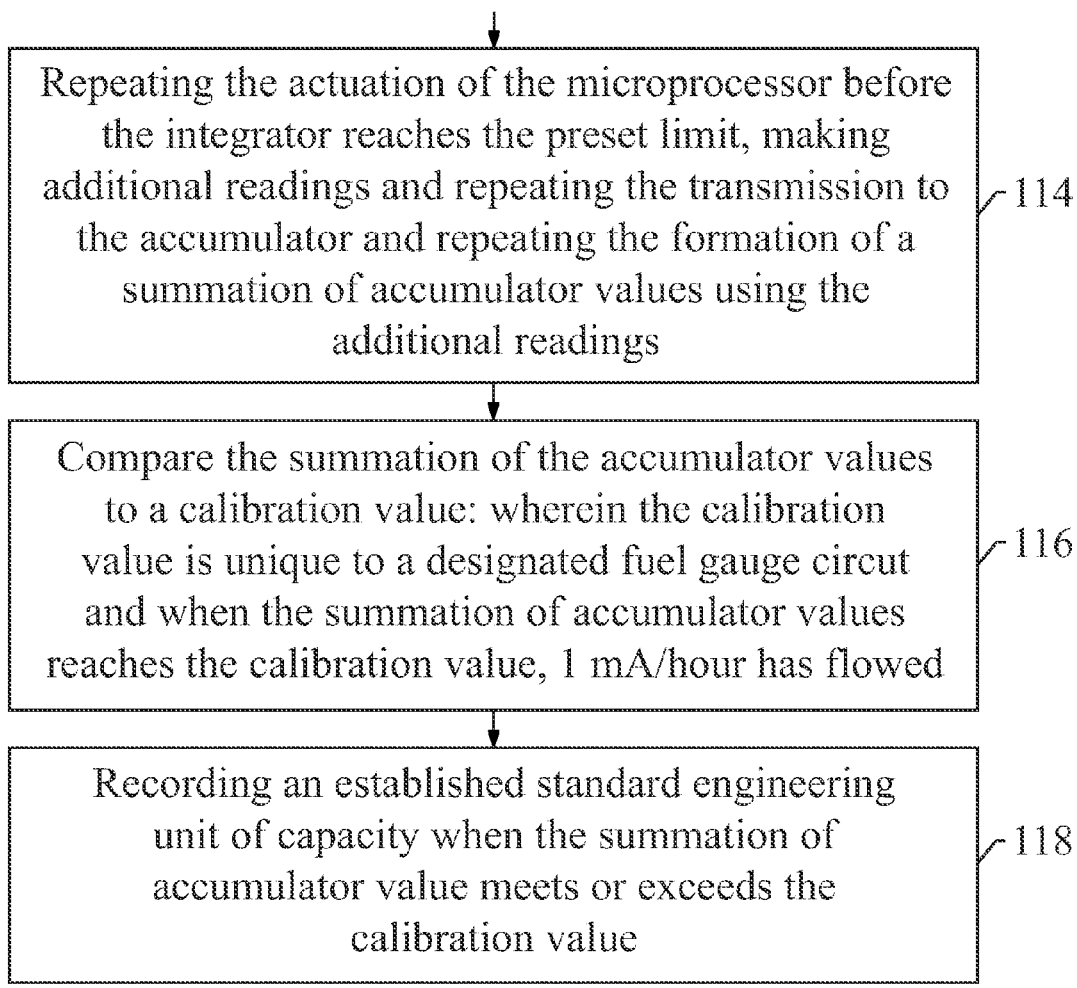

FIG. 2 shows a method for counting electrons from a power supply, the method comprising the following steps: measuring a current of a power supply forming a measured current (100); converting the measured current to a voltage (102); integrating the voltage into a monotonic uni-polar representation of an aggregate number of electrons having an amplitude representative of the aggregate number of electrons flowing through a current sense resistor using an integrator having a capacitor (104); actuating a microprocessor in communication with a data storage just before the integrator reaches a preset limit of aggregate electrons (106); reading the amplitude representative of the aggregate number of electrons from the integrator with the microprocessor forming a reading (108); transmitting the reading to an accumulator formed in the data storage forming an accumulator value (110); resetting the integrator after transmitting the reading (112); repeating the actuation of the microprocessor before the integrator reaches the preset limit, making additional readings and repeating the transmission to the accumulator and repeating the formation of a summation of accumulator values using the additional readings (114); compare the summation of accumulator values to a calibration value; wherein the calibration value is unique to a designated fuel gauge circuit and when the summation of accumulator values reaches the calibration value, 1 mA/hour has flowed (116) and recording an established standard engineering unit of capacity when the summation of accumulator values meets or exceeds the calibration value (118). A second accumulator can be used to record quantities of battery usage.

Figure 3:
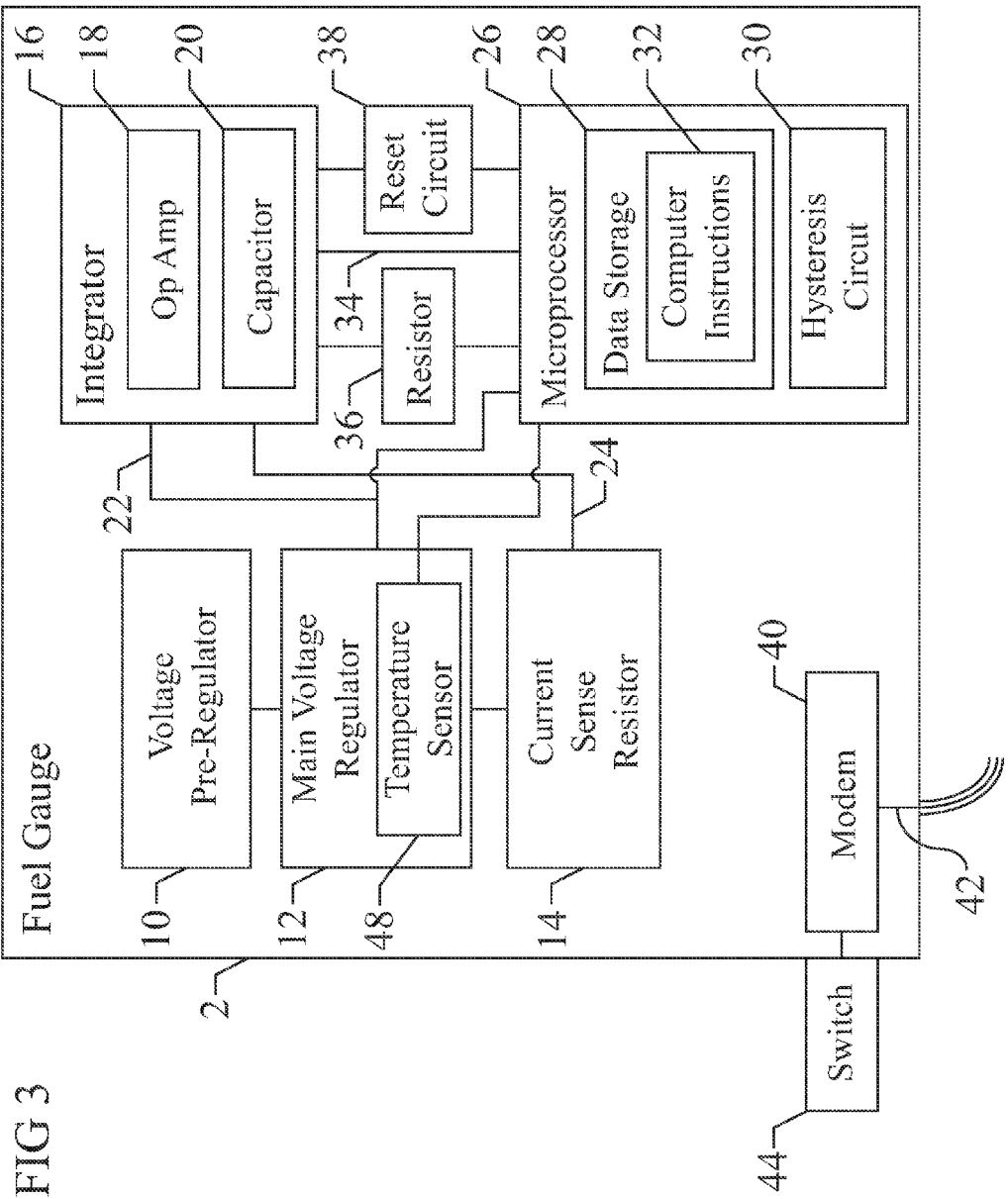
FIG. 3 is a diagram of a fuel gauge usable in the method according to one embodiment of the disclosure.

FIG. 3 shows the fuel gauge usable in this method. The fuel gauge has, in an embodiment, a voltage pre-regulator (10) for receiving current and providing a preset voltage. The voltage pre-regulator (10) is designed for 10-80V applications to provide 6 Volts. In an embodiment, the voltage pre-regulator can be resistant to extreme temperature, high pressure, shock and vibration.

Additionally, the fuel gauge has a main voltage regulator (12) in communication with the voltage pre-regulator for receiving the preset voltage and providing power to other components of the fuel gauge. The regulator can be a band gap device, designed for precision measurement applications, and is contemplated to be precise to within about 1 percent. In an embodiment, the main voltage regulator can have a maximum voltage tolerance of about 80V. In one embodiment the main voltage regulator can contain a temperature sensor (48).

An example of the voltage pre-regulator would be one such as LT3014BES5 made by Micropower. An example of the main voltage regulator would be one such as those produced by Analog Devices.

A current sense resistor (14), such as a model WSL2512RI000FEA resistor made by Vishay, is in communication with the main voltage regulator for converting the current to a voltage proportional to the current.

In an embodiment, the main voltage regulator can be a precision regulator, and the current sense resistor can be a precision resistor.

An integrator (16) is shown, comprising an op amp (18) such as a LTC2054HS5 made by Linear Technologies and a capacitor (20). The integrator (16) receives power (22) from the main voltage regulator, and an input voltage proportional to current (24) from the current sense resistor. In an embodiment, the integrator can have a saturation voltage ranging from about 0 volts to about 3 volts.

A microprocessor (26) with data storage (28), such as a MCQB8DTE made by Freescale, can be used in combination with a hysteresis circuit (30). Those of ordinary skill in the art can appreciate that the hysteresis circuit can be either be an external component for conditioning the amplitude signal of the integrator, or the hysteresis circuit can be contained within the microprocessor. The microprocessor is contemplated to remain in a low power state until activated. In one embodiment, the microprocessor can consume from one to three microwatts of power in the low power state.

The data storage, which can be fixed, removable, or remote data storage, can include computer instructions (32) for instructing the microprocessor to convert the voltage across the current sense resistor to a monotonic uni-polar representation of an 15 aggregate number of electrons (34).

A resistor (36) is disposed between the integrator and the microprocessor for activating the microprocessor from the low power state prior to saturation of the integrator with the voltage proportional to current.

A reset circuit (38) is disposed between the microprocessor and the integrator for resetting the monotonic uni-polar representation of an aggregate number of electrons to zero. In an embodiment, the reset circuit resets the integrator to zero in less than three microseconds for ensuring accuracy.

In an embodiment, the fuel gauge has a modem (40) for providing a communication signal (42) over power lines of the fuel gauge. A switch (44) can be used for controlling power to the modem.

In an embodiment, the op amp can be a low power and low drift device. The op amp can be one such as model LTC2054HS5 from Linear Technology which provides a low pollution due to noise. The op amp can receive power from the main voltage regulator. The op amp operates using a logic input that cycles to activate and deactivate the op amp.

The hysteresis circuit provides a discrete rapid output in response to a slowly changing input. The output of this circuit can be either logic 0 or 1, but input must change significantly for output to change.

While these embodiments have been described with emphasis on the embodiments, it should be understood that within the scope of the appended claims, the embodiments might be practiced other than as specifically described herein.

What is claimed is:

1. An apparatus, comprising:
   a current sensor coupled to an output of a power source;
   an integrator coupled to the current sensor;
   a memory configured to store an electron count value and a calibration value;
   a voltage regulator coupled to the current sensor and to the power source; and
   a microprocessor coupled to the current sensor, to the integrator, and to the memory, in which the microprocessor is configured to:
   obtain an electron count from the integrator;
   increment the electron count value stored in the memory by the electron count obtained from the integrator;
   read a calibration value from the memory; and
   calculate a power usage of the power source based, at least in part, on the electron count value and the calibration value.

2. The apparatus of claim 1, further comprising a hysteresis circuit coupled to the microprocessor in which the hysteresis circuit is configured to condition an amplitude of a signal received from the integrator.

3. The apparatus of claim 2, in which the hysteresis circuit is integrated with the microprocessor.

4. The apparatus of claim 1, further comprising an analog-to-digital converter coupled to the integrator and to the microprocessor, in which the microprocessor is further configured to obtain the electron count from the integrator as a digital value from the analog-to-digital converter.

5. The apparatus of claim 4, in which the analog-to-digital converter is integrated with the microprocessor.

6. The apparatus of claim 1, further comprising a modem coupled to the microprocessor, in which the microprocessor is configured to communicate at least one of the electron count value and the power usage through the modem.

7. The apparatus of claim 1, in which the calibration value is specific to the apparatus.

8. The apparatus of claim 1, further comprising a temperature sensor coupled to the microprocessor, in which the microprocessor is configured to:
   measure an ambient temperature from the temperature sensor; and
   adjust the calibration value based, at least in part, on the measured ambient temperature.

9. The apparatus of claim 1, in which the voltage regulator comprises a band gap device configured to provide power to the apparatus.

10. The apparatus of claim 1, further comprising a voltage pre-regulator coupled to the voltage regulator.

11. The apparatus of claim 10, in which the voltage pre-regulator is configured to receive a current and provide a preset voltage.

12. A method, comprising:
regulating, by a voltage regulator, a voltage for powering a fuel gauge;
obtaining, by a microprocessor of the fuel gauge, an electron count from an integrator coupled to a power source;
incrementing, by the microprocessor, an electron count value in a memory by the obtained electron count;
reading, by the microprocessor from the memory, a calibration value; and
calculating, by the microprocessor, a power usage of the power source based, at least in part, on the electron count value and the calibration value stored in the memory.

13. The method of claim 12, further comprising resetting, by the microprocessor, the integrator when the electron count is obtained from the integrator.

14. The method of claim 12, further comprising converting the power usage of the power source into an established unit of capacity based, at least in part, on the calibration value.

15. The method of claim 12, further comprising:
measuring an ambient temperature of the power source; and
adjusting the calibration value based, at least in part, on the measured ambient temperature.

16. The method of claim 12, further comprising reporting, by the microprocessor to a remote monitor through a modem, at least one of the electron count value and the power usage of the battery.

17. The method of claim 12, in which obtaining the electron count comprises receiving an analog signal from the integrator, the method further comprising conditioning the analog signal received from the integrator.

18. An apparatus, comprising:
a current sensor coupled to an output of a power source;
an integrator coupled to the current sensor;
a memory configured to store an electron count value and a calibration value;
a hysteresis circuit coupled to the microprocessor in which the hysteresis circuit is configured to condition an amplitude of a signal received from the integrator; and
a microprocessor coupled to the current sensor, to the integrator, and to the memory, in which the microprocessor is configured to:
obtain an electron count from the integrator;
increment the electron count value stored in the memory by the electron count obtained from the integrator;
read a calibration value from the memory; and
calculate a power usage of the power source based, at least in part, on the electron count value and the calibration value.

19. The apparatus of claim 18, in which the hysteresis circuit is integrated with the microprocessor.

20. The apparatus of claim 18, further comprising an analog-to-digital converter coupled to the integrator and to the microprocessor, in which the microprocessor is further configured to obtain the electron count from the integrator as a digital value from the analog-to-digital converter, in which the analog-to-digital converter is integrated with the microprocessor.

* * * * *